(12) United States Patent
Riviere et al.

(10) Patent No.: US 9,420,685 B2
(45) Date of Patent: Aug. 16, 2016

(54) ELECTRONIC DEVICE COMPRISING A SUBSTRATE BOARD EQUIPPED WITH A LOCAL REINFORCING OR BALANCING LAYER

(71) Applicant: STMicroelectronics (Grenoble 2) SAS, Grenoble (FR)

(72) Inventors: Jean-Michel Riviere, Froges (FR); Karine Saxod, Les Marches (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 115 days.

(21) Appl. No.: 14/444,583

(22) Filed: Jul. 28, 2014

(65) Prior Publication Data

US 2015/0036309 A1 Feb. 5, 2015

(30) Foreign Application Priority Data

Jul. 30, 2013 (FR) ...................................... 13 57515

(51) Int. Cl.
| | |
|---|---|
| *H05K 1/02* | (2006.01) |
| *H05K 1/18* | (2006.01) |
| *H05K 3/30* | (2006.01) |
| *H05K 3/28* | (2006.01) |
| *H01L 23/498* | (2006.01) |
| *H01L 23/00* | (2006.01) |

(52) U.S. Cl.
CPC ........ *H05K 1/0271* (2013.01); *H01L 23/49844* (2013.01); *H01L 23/562* (2013.01); *H05K 1/181* (2013.01); *H05K 3/28* (2013.01); *H05K 3/30* (2013.01); *H01L 24/16* (2013.01); *H01L 2224/16111* (2013.01); *H01L 2224/16237* (2013.01); *H05K 2201/0275* (2013.01); *H05K 2201/09909* (2013.01); *H05K 2201/10007* (2013.01); *H05K 2201/2009* (2013.01); *Y10T 29/4913* (2015.01)

(58) Field of Classification Search
CPC .................................................... H05K 3/0064
USPC .......................................... 174/260; 257/787
See application file for complete search history.

(56) References Cited

U.S. PATENT DOCUMENTS

| | | | |
|---|---|---|---|
| 5,426,568 | A | 6/1995 | Lamers et al. |
| 6,274,821 | B1 | 8/2001 | Echigo et al. |
| 6,362,433 | B1 | 3/2002 | Takahashi et al. |
| 6,472,598 | B1 * | 10/2002 | Glenn ........................... 174/535 |
| 7,501,585 | B2 * | 3/2009 | Killer et al. ................... 174/260 |
| 2003/0000723 | A1 | 1/2003 | Singh |
| 2005/0224252 | A1 | 10/2005 | Mishiro |
| 2007/0029569 | A1 * | 2/2007 | Andrews ......................... 257/99 |
| 2010/0207265 | A1 | 8/2010 | Muthukumar et al. |

FOREIGN PATENT DOCUMENTS

| | | |
|---|---|---|
| JP | H09172104 A | 6/1997 |
| WO | WO-0147015 A2 | 6/2001 |

OTHER PUBLICATIONS

INPI Search Report and Written Opinion for FR 1357515 mailed Mar. 26, 2014 (7 pages).

* cited by examiner

*Primary Examiner* — Jeremy C Norris
(74) *Attorney, Agent, or Firm* — Gardere Wynne Sewell LLP

(57) ABSTRACT

A substrate board includes an electrical connection network on a face thereof. An integrated-circuit chip is mounted to the face of the substrate board in electrical contact with the electrical connection network. A local reinforcing or balancing layer made of a non-metallic material is mounted to the face of the substrate board in at least one local zone free of the face which is free of metal portions of the electrical connection network.

21 Claims, 2 Drawing Sheets

ELECTRONIC DEVICE COMPRISING A SUBSTRATE BOARD EQUIPPED WITH A LOCAL REINFORCING OR BALANCING LAYER

PRIORITY CLAIM

This application claims priority from French Application for Patent No. 1357515 filed Jul. 30, 2013, the disclosure of which is incorporated by reference.

TECHNICAL FIELD

The present invention relates to the field of electronic devices that comprise substrate boards equipped with electrical connection networks and integrated-circuit chips mounted on these substrate boards and connected to these networks.

BACKGROUND

Generally, electrical connection networks comprise metal electrical connection tracks, local metal connection zones, and possibly metal vias passing through the substrate boards. These electrical connection networks, and optionally other metal portions, form metal masses that are irregularly distributed over the surface and possibly in the interior of the substrate boards.

In the case where certain connections of the electrical connection networks are intended to transfer high-frequency signals, such as video signals, zones near these connections must be free from metal portions in order to prevent electromagnetic interference. The irregularity of the distribution of these metal portions over the substrate boards is then further accentuated.

This results in such substrate boards deforming (warping or sagging), causing planarity defects that result in local electrical connection zones not being coplanar. Integrated-circuit chips mounted on the substrate boards, by way of electrical connection elements such as balls, metal pads or electrical connection wires, in these local electrical connection zones, run the risk of having electrical connections that are defective or missing.

There is a need in the art to reduce the above drawbacks.

SUMMARY

An electronic device is provided, which device comprises a substrate board equipped with an electrical connection network and at least one integrated-circuit chip mounted on said substrate board, the substrate board being equipped with an electrical connection network with a view to making electrical connections between said integrated-circuit chip and the exterior.

In such an electronic device, at least one face of the substrate board is equipped with at least one local reinforcing or balancing layer made of a non-metallic material added to at least one local zone free from metal portions.

Said local reinforcing or balancing layer may be placed in at least one local zone of the substrate board adjacent to a portion of the electrical connection network and free from metal portions.

Said local reinforcing or balancing layer may comprise a plurality of points of non-metal material bonded from above to the substrate board.

Said local reinforcing or balancing layer may comprise at least one line or bead of non-metallic material bonded from above to the substrate board.

Said local reinforcing or balancing layer may comprise at least one non-metallic film bonded to the substrate board.

Said substrate board may be equipped with a superficial passivating layer on which said local reinforcing or balancing layer is placed.

Said substrate board may be equipped with a superficial passivating layer containing at least one hole, said local reinforcing or balancing layer being engaged in this hole.

A process for fabricating an electronic device is also provided, which process comprises: adding a local reinforcing (or balancing) layer made of a non-metallic material to a zone free from metal portions of a substrate board equipped with an electrical connection network, then mounting an integrated-circuit chip onto the substrate board by way of electrical connection elements placed in metal zones of said electrical connection network.

BRIEF DESCRIPTION OF THE DRAWINGS

Electronic devices will now be described by way of non-limiting example, and illustrated by the appended drawings, in which.

DETAILED DESCRIPTION OF THE DRAWINGS

Figure 1:
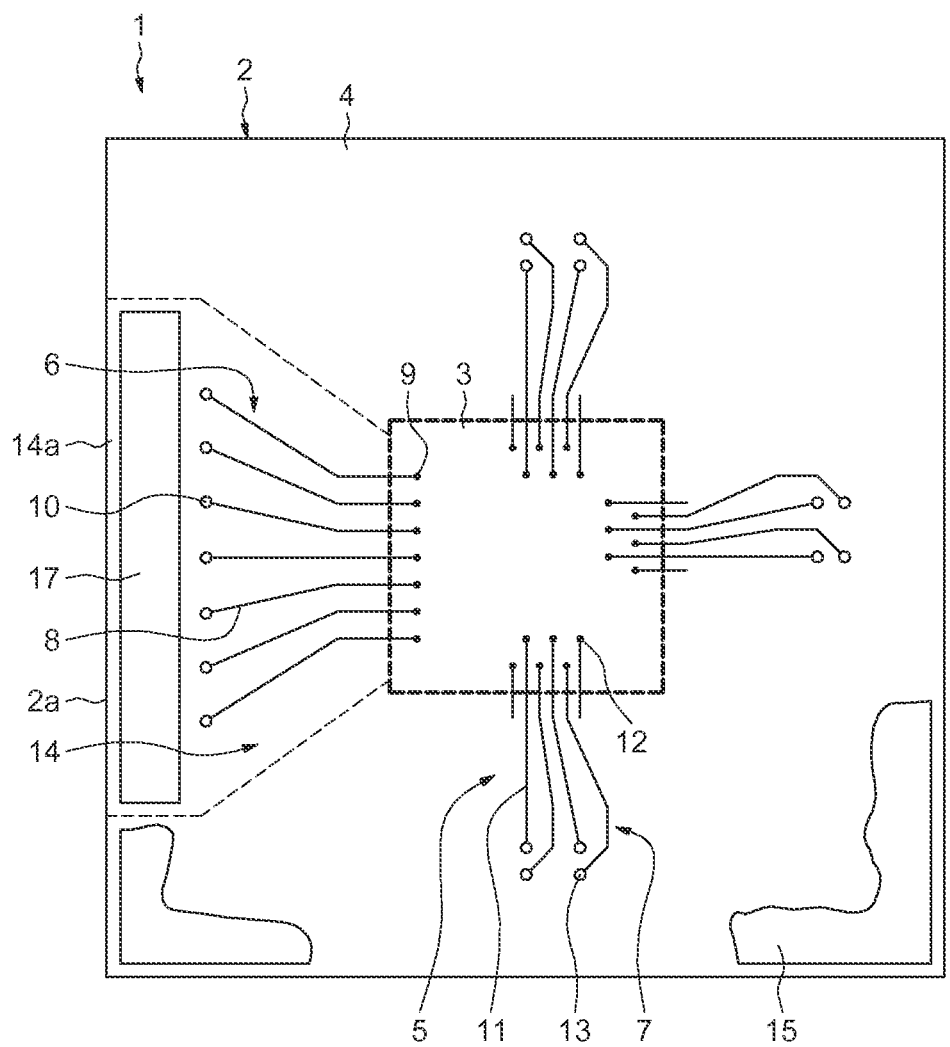
FIG. 1 shows a top view of an electronic device.
Figure 2:
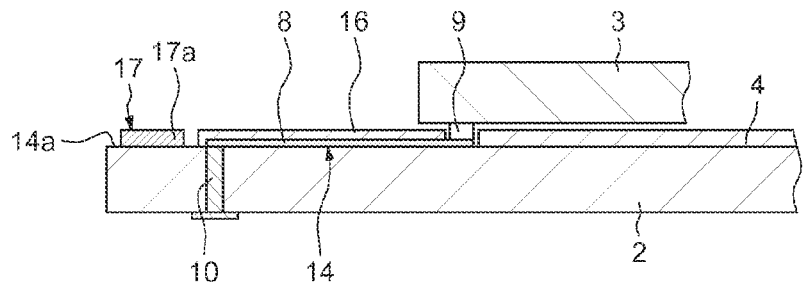
FIG. 2 shows a cross-sectional view of the electronic device, according to one embodiment.

FIGS. 1 and 2 illustrate an electronic device 1 that comprises a substrate board 2 made of an insulator, and an integrated-circuit chip 3 placed flat a small distance above one face 4 of the substrate board 1.

The substrate board 2 is equipped with an electrical connection network 5 allowing electrical connections to be made between the integrated-circuit chip 3 and the exterior.

The electrical connection network 5 comprises a plurality of electrical connections 6, for example for transferring video signals, and a plurality of electrical connections 7 for transferring all the other signals and supplying electrical power to the integrated-circuit chip 3.

The electrical connections 6 comprise, on the face 4 of the substrate board 2, metal connection lines 8, metal connection elements 9 that are interposed and soldered between the integrated-circuit chip 3 and the substrate board 2 and that electrically connect internal ends of the connection lines 8 to the integrated-circuit chip 3, and metal electrical connection vias 10 that pass through the substrate board 2 and that, by way of their end located on the face 4 side, are connected to external ends of the connection lines 8.

Equivalently, the electrical connections 7 comprise metal connection lines 11, metal electrical connection elements 12, and metal electrical connection vias 13.

The metal vias 10 and 13 are placed between the integrated-circuit chip 3 and the peripheral edges of the substrate board 2. By way of their end located on the bottom face side, opposite the face 4 of the substrate board 2, the vias 10 and 13 may be connected to another electronic device (not shown) by way of connection elements (not shown).

In the example illustrated, the electrical connections 6 are distributed on one side of the integrated-circuit chip 3 and the electrical connections 7 are distributed over the three other sides of the integrated-circuit chip 3.

The metal connection lines 8 of the electrical connections 6 lie next to one another, and the metal vias 10 are aligned in a row parallel to the corresponding edge 2a of the substrate board 2.

Except from the metal from which they are made, the electrical connections 6 are formed in a region 14 of the substrate board free from other metal portions in order to prevent the signals transferred by the connections 6 from being distorted.

Furthermore, the substrate board 2 is optionally equipped with metal regions 15 located on its face 4 or incorporated between the layers.

A superficial passivating layer 16 made of an insulator extends over the face 4 of the substrate board 2.

In a zone 14a of the region 14 free from metal portions, which is located between the metal vias 10 and the corresponding edge 2a of the substrate board 2, the passivating layer 16 has been removed and the substrate board 2 is equipped, on its face 4, with an added local reinforcing or balancing layer 17 made of a non-metallic material that does not distort the signals transferred by the connections 6.

In the embodiment illustrated in FIG. 2, the local reinforcing or balancing layer 17 is formed by at least one line or bead 17a of a deposited non-metallic material, or by a non-metallic film bonded to the face 4 of the substrate board 2.

Figure 3:
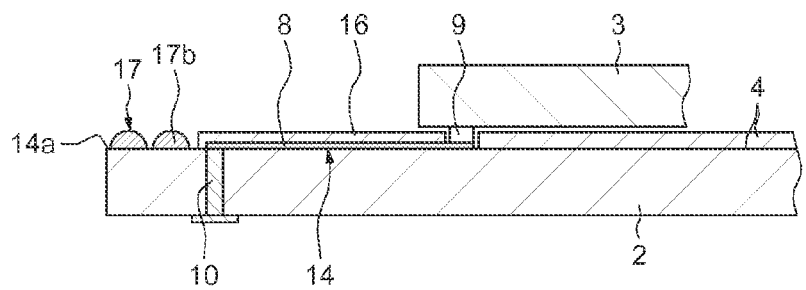
FIG. 3 shows a cross-sectional view of the electronic device, according to another embodiment.

In another embodiment illustrated in FIG. 3, the local reinforcing or balancing layer 17 is formed by a plurality of points 17b of a deposited non-metallic material. These points 17a may be located near one another and be regularly or irregularly distributed. For example, these points 17a may be deposited through a removable perforated mask (not shown).

Figure 4:
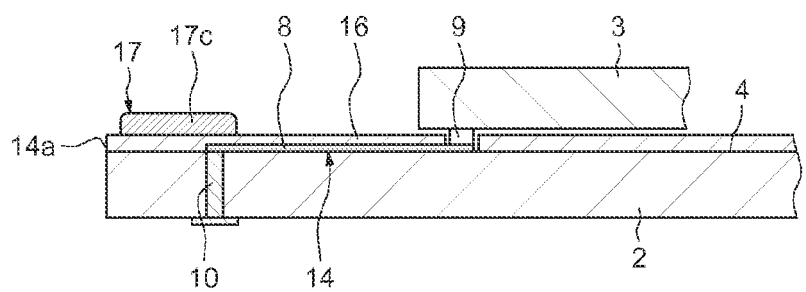
FIG. 4 shows a cross-sectional view of the electronic device, according to another embodiment.

In another embodiment illustrated in FIG. 4, the passivating layer 16 has not been removed from the zone 14a of the region 14 free from metal portions, and the added local reinforcing or balancing layer 17 comprises at least one portion 17c formed directly on this passivating layer 16, this time without strict limitation to the zone 14a.

Figure 5:
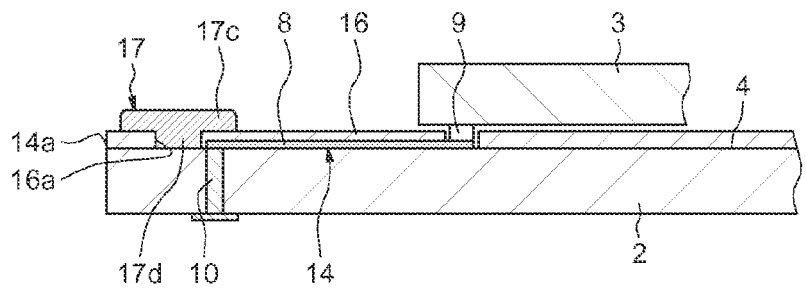
FIG. 5 shows a cross-sectional view of the electronic device, according to another embodiment.

In another embodiment illustrated in FIG. 5, the added local reinforcing or balancing layer 17 of FIG. 4 contains portions 17d inserted in holes 16a produced in the passivating layer 16.

As a result of the above the substrate board 2 is equipped with metal portions that are not regularly distributed over its surface, especially due to the existence of the specific region 14 in which the electrical connections 6 are exclusively provided.

Adding the local reinforcing or balancing layer 17 to the region 14 allows this irregularity to be compensated for in order for the substrate board 2 not to exhibit warping and/or sagging that could hinder the mounting of the integrated-circuit chip 3 by way of the electrical connection elements 9 and 12 and the mounting of the substrate board 2 on another electronic device, as mentioned above.

According to another embodiment, one or more added local reinforcing or balancing layers, equivalent to the local layer 17, could be provided in other locations on the substrate board 2 and for the same purpose.

The electronic device 1 may be fabricated in the following way.

Having previously produced the substrate board 2 equipped with the desired electrical connection network 5, the reinforcing layer 17 is produced. The shape, position and material of this reinforcing layer 17, which may comprise one or more portions, are chosen so as to prevent any warping and/or sagging of the substrate board 2.

In the case where the reinforcing or balancing layer 17 is formed by at least one deposited line, bead or droplet, the material from which it is made may be a thermosetting epoxy adhesive. In the case where the reinforcing or balancing layer 17 is formed by a bonded film, the material may be an acrylic, epoxy or polyester resin.

Next, the integrated-circuit chip 2 is positioned and mounted on the substrate board 2 by way of the electrical connection elements 9 and 12.

The present invention is not limited to the example described above. Variant embodiments are possible without departing from the scope of the invention.

What is claimed is:

1. An electronic device, comprising:
a substrate board having a front face;
at least one integrated-circuit chip mounted to the front face of said substrate board;
wherein the substrate board further includes an electrical connection network mounted on said front face and configured to make electrical connections to said integrated-circuit chip and further having a metal region;
at least one local reinforcing or balancing layer made of a non-metallic material mounted to a face of the substrate board in at least one local zone of the substrate board which is free of metal portions of said electrical connection network; and
wherein said electrical connection network includes vias extending through the substrate board, and
wherein said at least one local zone and said at least one local reinforcing or balancing layer are located between said vias and a peripheral edge of the substrate board, and said at least one local reinforcing or balancing layer does not extend over the vias.

2. The device according to claim 1, wherein the at least one local zone of the substrate board is located on the front face adjacent to a portion of the electrical connection network, and said local reinforcing or balancing layer is mounted to the front face in the local zone.

3. The device according to claim 1, wherein said local reinforcing or balancing layer comprises a plurality of points of non-metallic material bonded to the substrate board.

4. The device according to claim 1, wherein said local reinforcing or balancing layer comprises at least one line or bead of non-metallic material bonded to the substrate board.

5. The device according to claim 1, wherein said local reinforcing or balancing layer comprises at least one non-metallic film bonded to the substrate board.

6. The device according to claim 1, further including a superficial passivating layer mounted to the front face of the substrate board over the electrical connection network.

7. The device according to claim 6, wherein the superficial passivating layer is not present in the at least one local zone where said local reinforcing or balancing layer is mounted.

8. The device according to claim 6, wherein the superficial passivating layer contains at least one hole, and wherein said local reinforcing or balancing layer is disposed in the at least one hole.

9. A process for fabricating an electronic device, comprising:
adding a local reinforcing or balancing layer made of a non-metallic material to a zone free from metal portions of a substrate board equipped with an electrical connection network and a metal region, then mounting an integrated-circuit chip onto the substrate board by way of electrical connection elements placed in metal zones of said electrical connection network;

opening a hole in the superficial passivating layer; and depositing a superficial passivating layer on the substrate board over the metal portions, wherein at least a portion of the local reinforcing or balancing layer is added in said hole.

10. The process of claim 9, wherein said local reinforcing or balancing layer comprises a plurality of points of non-metallic material bonded to the substrate board.

11. The process of claim 9, wherein said local reinforcing or balancing layer comprises at least one line or bead of non-metallic material bonded to the substrate board.

12. The process of claim 9, wherein said local reinforcing or balancing layer comprises at least one non-metallic film bonded to the substrate board.

13. An electronic device, comprising:
a substrate board having, on a front face thereof, an electrical connection network, a metal region separate from said electrical connection network, and a local reinforcing layer made of a non-metallic material positioned in a local zone of the substrate board which is free of the metal region and said electrical connection network;

at least one integrated-circuit chip mounted to the front face of said substrate board and electrically connected to said electrical connection network; and a superficial passivating layer mounted to the front face of the substrate board over the electrical connection network, wherein the superficial passivating layer contains at least one hole, and wherein a portion of said local reinforcing layer is disposed in said hole.

14. The device according to claim 13, wherein said local reinforcing layer comprises one of: a plurality of points of non-metallic material bonded to the substrate board; a line or bead of non-metallic material bonded to the substrate board; or a non-metallic film bonded to the substrate board.

15. An electronic device, comprising:
a substrate board having, on a front face thereof, an electrical connection network, a metal region separate from said electrical connection network, and a local reinforcing layer made of a non-metallic material positioned in a local zone of the substrate board which is free of the metal region and said electrical connection network;

at least one integrated-circuit chip mounted to the front face of said substrate board and electrically connected to said electrical connection network;

a plurality of vias extending through the substrate board; and wherein said local reinforcing layer extends over but is not electrically connected to said plurality of vias.

16. The device according to claim 15, further including a superficial passivating layer mounted to the front face of the substrate board over the electrical connection network and the plurality of vias.

17. The device according to claim 15, wherein said local reinforcing layer comprises a plurality of points of non-metallic material.

18. The device according to claim 15, wherein said local reinforcing layer comprises at least one line or bead of non-metallic material.

19. The device according to claim 18 wherein said local reinforcing layer comprises a thermosetting epoxy adhesive.

20. The device according to claim 15, wherein said local reinforcing layer comprises at least one non-metallic film.

21. The device according to claim 20 wherein a material of said local reinforcing layer is selected from a group consisting of: an acrylic, an epoxy resin, and a polyester resin.

* * * * *